(12) United States Patent
Wang et al.

(10) Patent No.: US 11,689,122 B2
(45) Date of Patent: Jun. 27, 2023

(54) NONLINEAR MAGNETIC FORCE-BASED ARCHED PIEZOELECTRIC CERAMIC ENERGY HARVESTING DECELERATION STRIP

(71) Applicants: Jun Wang, Wenzhou (CN); Zhiming Liu, Wenzhou (CN); Yaguang Ding, Wenzhou (CN); Yuanqiang Cai, Wenzhou (CN); Hongtao Fu, Wenzhou (CN); Peng Wang, Wenzhou (CN); Guohui Yuan, Wenzhou (CN); Junfeng Ni, Wenzhou (CN); Ziyang Ggao, Wenzhou (CN)

(72) Inventors: Jun Wang, Wenzhou (CN); Zhiming Liu, Wenzhou (CN); Yaguang Ding, Wenzhou (CN); Yuanqiang Cai, Wenzhou (CN); Hongtao Fu, Wenzhou (CN); Peng Wang, Wenzhou (CN); Guohui Yuan, Wenzhou (CN); Junfeng Ni, Wenzhou (CN); Ziyang Ggao, Wenzhou (CN)

(73) Assignee: Wenhou University, Wenzhou (CN)

( * ) Notice: Subject to any disclaimer, the term of this patent is extended or adjusted under 35 U.S.C. 154(b) by 284 days.

(21) Appl. No.: 16/992,141

(22) Filed: Aug. 13, 2020

(65) Prior Publication Data
US 2022/0052629 A1 Feb. 17, 2022

(51) Int. Cl.
*H02N 2/18* (2006.01)
*H10N 30/853* (2023.01)

(52) U.S. Cl.
CPC ............. *H02N 2/183* (2013.01); *H02N 2/181* (2013.01); *H10N 30/853* (2023.02)

(58) Field of Classification Search
CPC ............... H01L 41/113; H01L 41/1132; H01L 41/1134; H01L 41/1136; H01L 41/1138; H02N 2/181; H02N 2/183
USPC ......................................................... 310/339
See application file for complete search history.

(56) References Cited

U.S. PATENT DOCUMENTS

| | | | | |
|---|---|---|---|---|
| 3,539,841 A * | 11/1970 | Riff | ............................. | H02N 2/18 310/70 R |
| 10,171,010 B2 * | 1/2019 | Kleipa | ...................... | H02N 2/18 |
| 10,355,623 B1 * | 7/2019 | Yavid | .................... | H03H 9/2463 |
| 11,011,696 B1 * | 5/2021 | Peters | ........................ | H02K 7/02 |
| 2009/0058099 A1 * | 3/2009 | Ghassemi | ................. | H02N 2/18 290/4 B |

* cited by examiner

*Primary Examiner* — Derek J Rosenau

(57) ABSTRACT

A nonlinear magnetic force-based arched piezoelectric ceramic energy harvesting deceleration strip, which comprises an outer case and an internal generating mechanism. The outer case structure comprises an upper deceleration strip and a casing. The casing is embedded in the pavement structure by excavating the upper part of surface course. A rebounding mechanism is located between the upper deceleration strip and casing to restore the pressed upper deceleration strip. Features: the generating mechanism comprises a rack, a gear set and generating discs. The rack is disposed at the bottom of the upper deceleration strip and moving up and down therewith. The rack can drive the gear set to generate acceleration, and the transmission shafts drive the left and right generating discs to rotate. The gear set is combined with three transmission shafts.

15 Claims, 6 Drawing Sheets

NONLINEAR MAGNETIC FORCE-BASED ARCHED PIEZOELECTRIC CERAMIC ENERGY HARVESTING DECELERATION STRIP

BACKGROUND OF INVENTION

1. Field of the Invention

The present invention relates generally to a piezoelectric generating deceleration strip, and more particularly to a nonlinear magnetic force-based arched piezoelectric ceramic energy harvesting deceleration strip, it is of piezoelectric energy harvesting and deceleration strip design domain.

2. Description of Related Art

Up to the end of 2018, the total length of highways in Taiwan exceeded 4,696.3 thousand kilometers. A great deal of mechanical vibration energy dissipated in the road structures, using piezoelectric material to convert mechanical energy into electric energy has become a popular research subject, but there are no mature piezoelectric transduction technology and practical engineering test study for the moment.

At present, the deceleration strips on the market are universally free of autonomous power supply function, there are some patents for deceleration strip power generation, but there are different problems. For example, the power generation of solar power generation deceleration strip is restricted by environmental factors, the hydraulic power generation deceleration strip burial volume is too large, destroying the pavement structure, and the electricity generation of piezoelectric generating deceleration strip is insufficient.

More energy can be collected by using piezoelectric nonlinear broadband energy harvesting, the mechanical energy generated under a carload effect can be fully used. The arched piezoelectric transducer ranks first in the energy harvesting of various piezoelectric transducers, the existing THUNDER and RAINBOW arched piezoelectric transducers have lower bearing capacity, they are inapplicable to road power generation systems, so the self-developed arched piezoelectric transducer is used, which has adequate bearing capacity, even as the piezoelectric transducer for roads, when the thickness of spring steel sheet is adjusted, its bearing capacity can be 1.5 kN. Moreover, according to actual laboratory test, its generating power is over 30 times of planar piezoelectric transducer. The lifting piezoelectric deceleration strip requires a small burial volume, damaging the road slightly, it is considerably advantageous in practical application.

SUMMARY OF THE INVENTION

In view of the aforethe deficiencies in current generating deceleration strip, the present invention aims to provide a nonlinear magnetic force-based arched piezoelectric ceramic energy harvesting deceleration strip, the arched piezoelectric ceramic energy harvesting deceleration strip has smaller burial volume and larger electricity generation.

To solve the above problems, the technical solution of the present invention is as follows:

A nonlinear magnetic force-based arched piezoelectric ceramic energy harvesting deceleration strip comprising: an outer case and an internal generating mechanism; wherein the outer case structure includes an upper deceleration strip and a casing; the casing is embedded in the pavement structure by excavating the upper part of surface course; a rebounding mechanism located between the upper deceleration strip and casing to restore the pressed upper deceleration strip; wherein the generating mechanism includes a rack, a gear set and generating discs; the rack is disposed at a bottom of the upper deceleration strip and moving up and down therewith; the rack engages with gear I, the gear I and gear II are fixed to transmission shaft I; the gear II engages with gear III to implement primary acceleration; the gear III and gear IV are fixed to transmission shaft II; the gear IV engages with gear V to implement secondary acceleration; finally, the gear V drives left and right generating discs to rotate through the transmission shaft III; the transmission shaft I, transmission shaft II and transmission shaft III are rotatably connected to a vertical steel plate; the generating disc comprises a fixed outer disc and a rotary inner disc; a turn of arched piezoelectric transducer is placed on the fixed outer disc; the first magnet is fixed to the apex of the arched piezoelectric transducer, the repellent second magnet of the same size is placed in the opposite position of the rotary inner disc; the arched piezoelectric transducer comprises a spring steel sheet base, an arched piezoelectric ceramic combined with the spring steel sheet base and an aluminum sheet adhering to the arched piezoelectric ceramic; the arched piezoelectric ceramic is fired and molded in an arched mold with preset curvature.

More particularly, a guide channel is disposed in the upper part of the casing, the upper deceleration strip is disposed in the guide channel, at least three guiding axles are fixed to the bottom of the upper deceleration strip, a return spring is fitted over the guiding axle, the upper end of return spring props the bottom of the upper deceleration strip, and the lower end props the bottom of the casing guide channel; the bottom of the casing is provided with a guide hole corresponding to the guiding axle, the guiding axle is inserted in the guide hole.

More particularly, the fixed outer disc is fixed to the casing through the vertical steel plate.

More particularly, wherein the fixed outer disc and the spring steel base are bolted, the first magnet is fixed to the aluminum sheet.

More particularly, wherein the spring steel sheet base and aluminum sheet are customized according to the curvature of arched piezoelectric ceramic.

More particularly, wherein the quantity of the second magnets of the rotary inner disc is 14, coincident with the quantity of the first magnets of the fixed outer disc, and the quantity of arched piezoelectric transducers of fixed outer disc is 14.

More particularly, the piezoelectric ceramics of the same fixed outer disc are connected in series, and the piezoelectric ceramics of different rotary outer discs are connected in parallel.

In comparison to the existing technology, the beneficial effects of the present invention include:

(1) Higher excitation frequency can be obtained by using piezoelectric nonlinear broadband energy harvesting, so as to collect more energy, the mechanical energy generated under a carload effect can be fully used.

(2) The arched piezoelectric transducer ranks first in the collection efficiency of various piezoelectric transducers, the existing THUNDER and RAINBOW arched piezoelectric transducers have lower bearing capacity, they are inapplicable to road power generation systems, so the self-developed arched piezoelectric transducer is used, the arched piezoelectric transducer is bonded of a spring steel sheet base, an arched piezoelectric ceramic and upper aluminum sheet. The arched piezoelectric ceramic is fired in an arched mold with predetermined curvature, so it has adequate bearing capacity, it is even used as the piezoelectric transducer for roads, when the thickness of spring steel sheet is adjusted, its bearing capacity can be 1.5 kN. Moreover, according to actual laboratory test, its generating power is over 30 times of planar piezoelectric transducer.

(3) The lifting piezoelectric deceleration strip can reduce the pounding of passing vehicles, enhancing the roadability, and its burial volume is not large, the damage to the pavement is slight, it has considerable advantages in practical application.

DETAILED DESCRIPTION OF THE INVENTION

Figure 1:
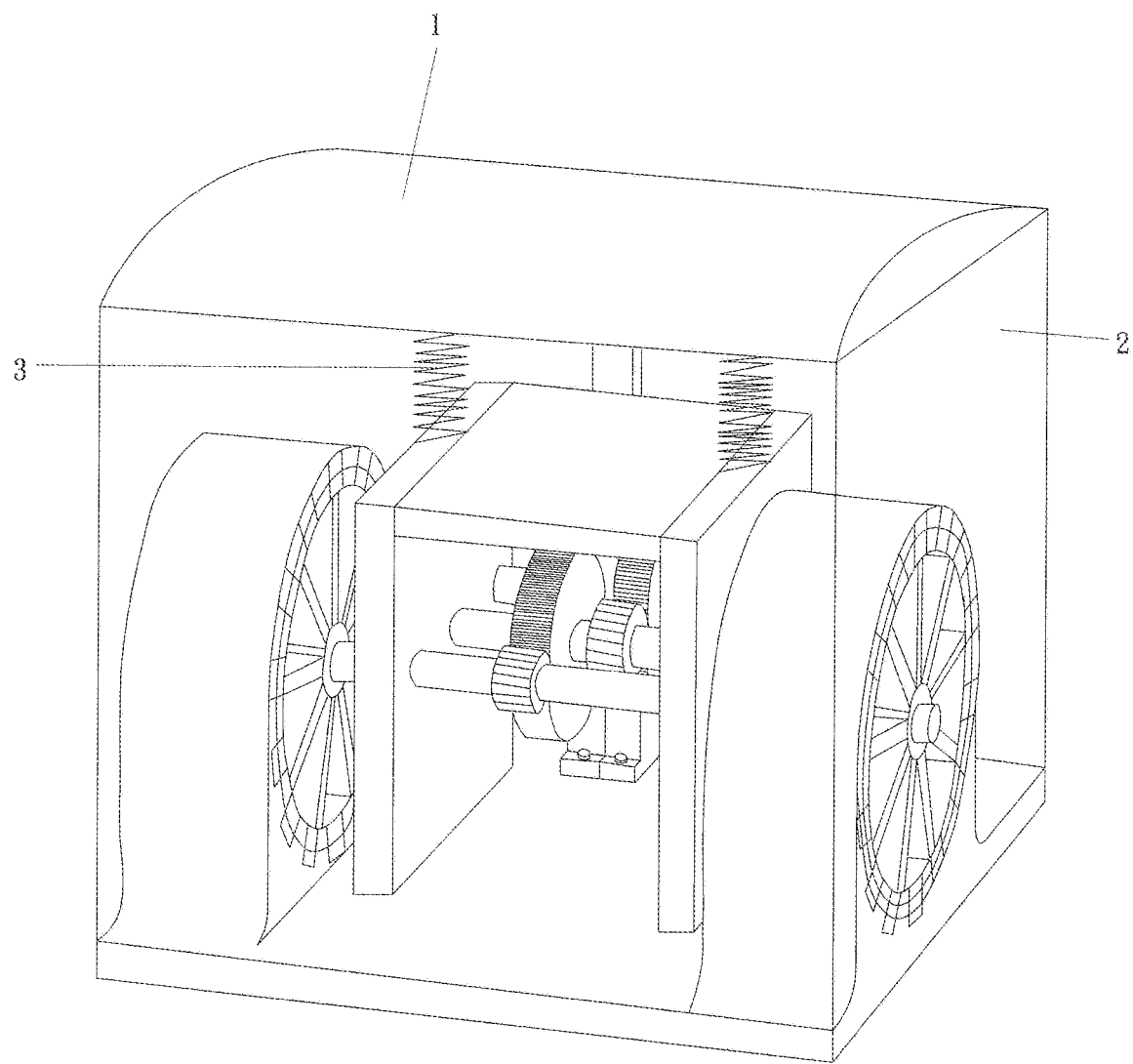
FIG. 1 is an overall structure diagram of the nonlinear magnetic force-based arched piezoelectric ceramic energy harvesting deceleration strip of the present invention.

As shown in FIGS. 1 to 6, the nonlinear magnetic force-based arched piezoelectric ceramic energy harvesting deceleration strip in Embodiment 1 of the present invention comprises an outer case and an internal generating mechanism. The outer case structure comprises an upper deceleration strip 1 and a casing 2. The casing 2 is buried in the pavement structure through the upper part of cut surface. A rebounding mechanism is located between the upper deceleration strip 1 and casing 2 to restore the pressed upper deceleration strip 1. The rebounding mechanism is generally composed of multiple springs 3 forming equilibrium distribution. In general cases, a spring 3 shall be placed at four corners respectively. The generating mechanism comprises a rack 4, a gear set and generating discs. The rack 4 is arranged at the bottom of the upper deceleration strip 1 and moving up and down with it. The rack 4 engages with gear I 5, gear I 5 and gear II 6 are fixed to transmission shaft I 10, gear II 6 engages with gear III 7 to implement primary acceleration. Gear III 7 and gear IV 8 are fixed to transmission shaft II 11. The gear IV 8 engages with gear V 9 to implement secondary acceleration. Finally, the gear V 9 drives the left and right generating discs to rotate through transmission shaft III 12. The transmission shaft I 10, transmission shaft II 11 and transmission shaft III 12 are rotatably connected to a vertical steel plate 14. The generating disc comprises a fixed outer disc 15 and a rotary inner disc 16. The fixed outer disc 15 is fixed to the casing 2 by the vertical steel plate 14. A turn of arched piezoelectric transducer 17 is placed on the fixed outer disc 15. A first magnet 181 is fixed to the apex of arched piezoelectric transducer 17, a heteropolar second magnet 182 of the same size is placed in the opposite position of the rotary inner disc 16. The arched piezoelectric transducer 17 comprises a spring steel sheet base 19, an arched piezoelectric ceramic 20 combined with the spring steel sheet base 19 and an aluminum sheet 21 adhering to the arched piezoelectric ceramic 20. The arched piezoelectric ceramic 20 is fired in an arched mold with predetermined curvature. The fixed outer disc 15 and the spring steel base 19 of arched piezoelectric transducer 17 are bolted. The first magnet 181 is fixed to the aluminum sheet 21.

Figure 5:
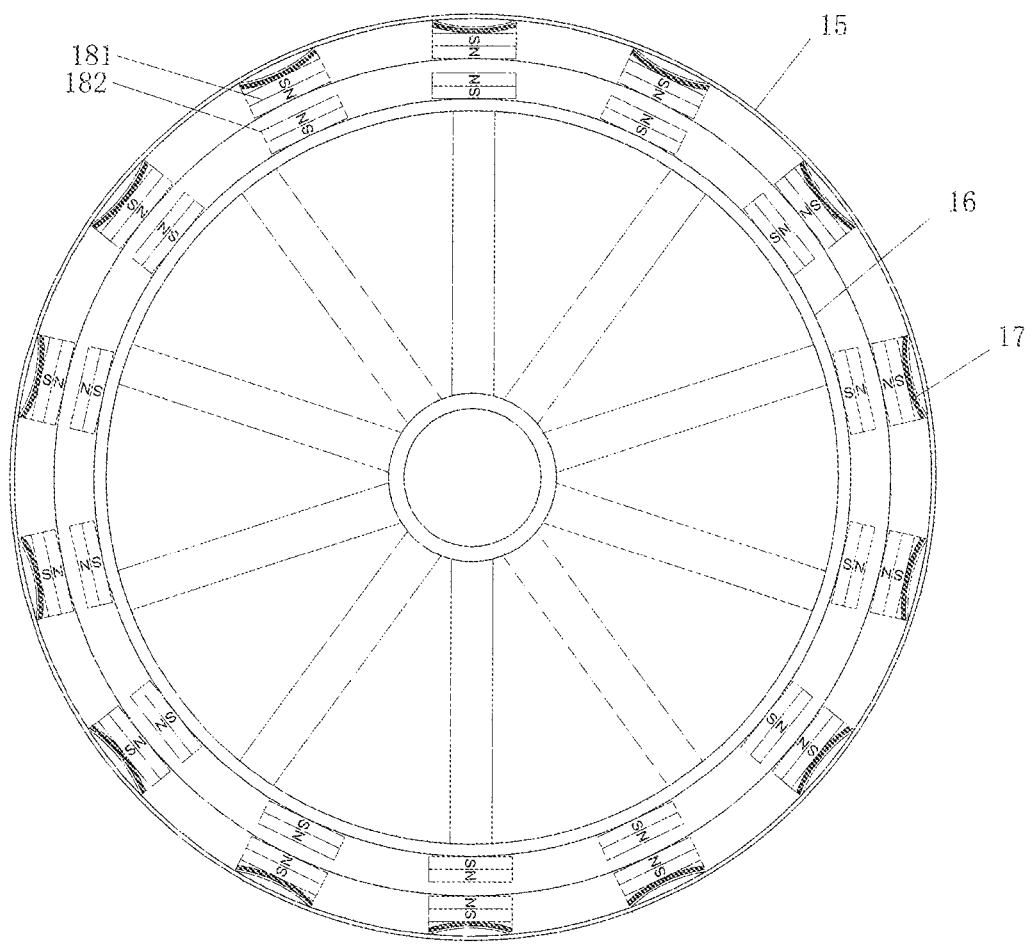
FIG. 5 is a structural diagram of fixed outer disc and rotary inner disc of the present invention.
Figure 6:
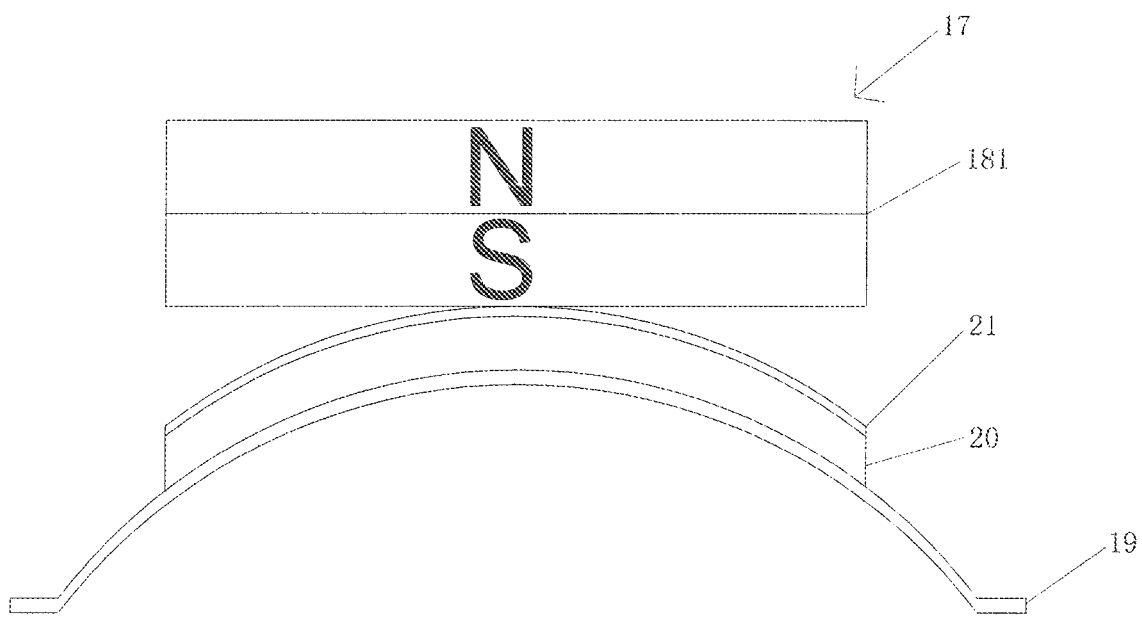
FIG. 6 is a structural diagram of arched piezoelectric transducer of the present invention.

As shown in FIGS. 5 and 6, the arched piezoelectric ceramic 20 of the arched piezoelectric transducer 17 is fired in an arched mold with preset curvature. The spring steel base 19 and aluminum sheet 21 are customized according to the curvature of arched piezoelectric ceramic 20. The quantity of the second magnets 182 of the rotary inner disc 16 is 14, coincident with the quantity of the first magnets 181 of the fixed outer disc 15, and the quantity of arched piezoelectric transducers 17 of rotary outer disc 15 is 14. The arched piezoelectric ceramics 20 of the same fixed outer disc 15 are connected in series, the arched piezoelectric ceramics 20 of different fixed outer discs 15 are connected in parallel.

Figure 7:
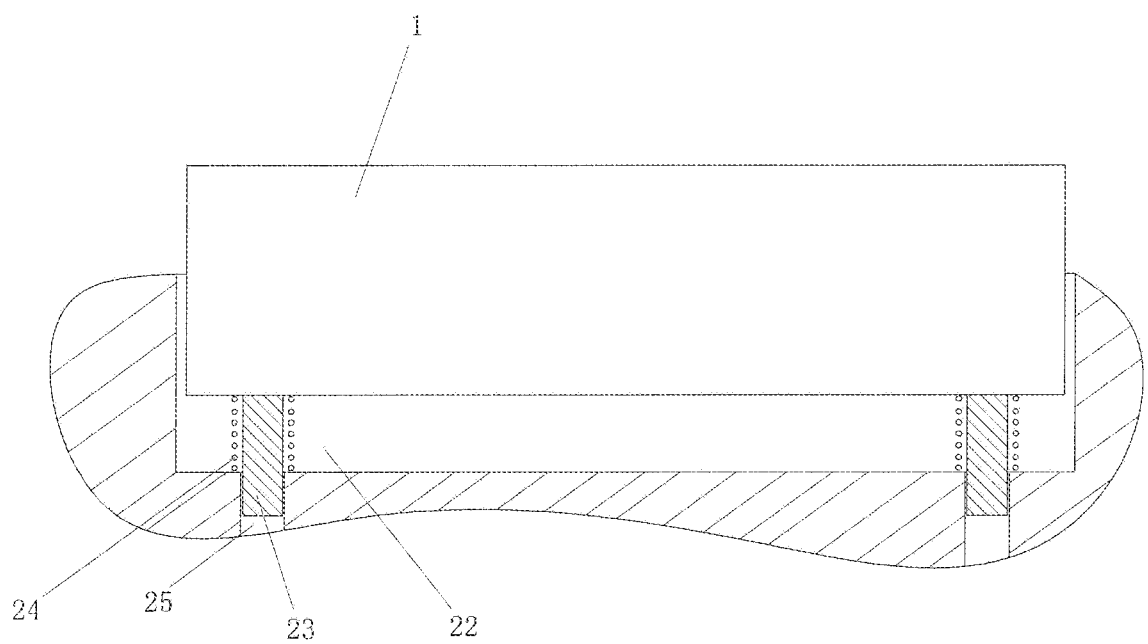
FIG. 7 is an overall structure diagram of the nonlinear magnetic force-based arched piezoelectric ceramic energy harvesting deceleration strip in Embodiment 2 of the present invention.

As shown in FIG. 7, the Embodiment 2 of the present invention is basically identical with Embodiment 1, the only difference is the up-and-down guide structure of upper deceleration strip 1. To be specific, a guide channel 22 is disposed in the upper part of the casing. The upper deceleration strip 1 is disposed in the guide channel 22. At least three guiding axles 23 are fixed to the bottom of the upper deceleration strip 1. A return spring 24 is fitted over the guiding axle 23, the upper end of return spring 24 props the bottom of upper deceleration strip 1, and the lower end props the bottom of the guide channel 22 of casing. The bottom of the guide channel 22 of the casing is provided with a guide hole 25 corresponding to the guiding axle 23. The guiding axle 23 is inserted in the guide hole 25. In order to implement balanced fluctuation better, four sets of guiding axle 23, guide hole 25 and return spring 24 are provided in general.

The structure details are described below according to the attached figures:

FIG. 1 is the schematic diagram of overall structure, including an outer case structure and a generating mechanism. When the deceleration strip receives the vehicle's impact force, the upper deceleration strip 1 structure descends, and the rack 4 descends accordingly and drives the generating disc 13 to rotate forward to generate electric energy. The rack rises when the device receives the resilience of buffer spring 3, driving the generating disc 13 to rotate backwards to generate electric energy. The casing 2 shall be buried in the surface structure by excavating the pavement, and the cracks shall be filled with SBS modified asphalt.

Figure 3:
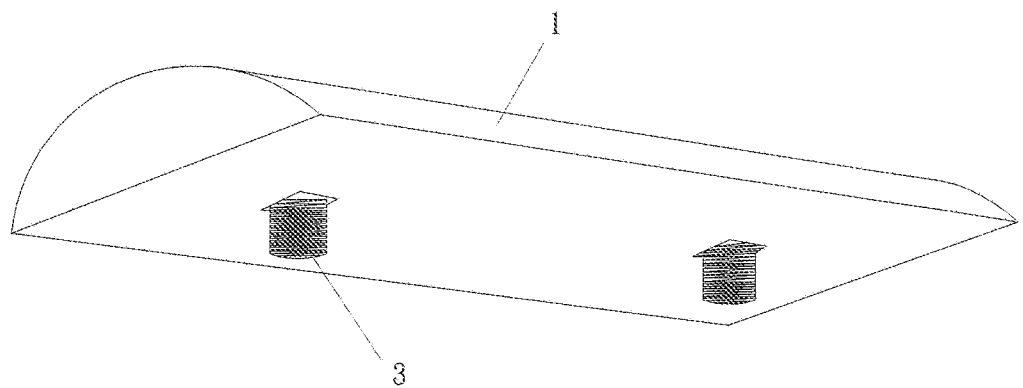
FIG. 3 is a structural diagram of the generating mechanism of the present invention.

FIG. 3 is the structural representation of upper deceleration strip, a buffer spring 3 is installed thereunder for raising the upper deceleration strip 1, and relevant joints are made waterproof by using waterproof rubber.

Figure 2:
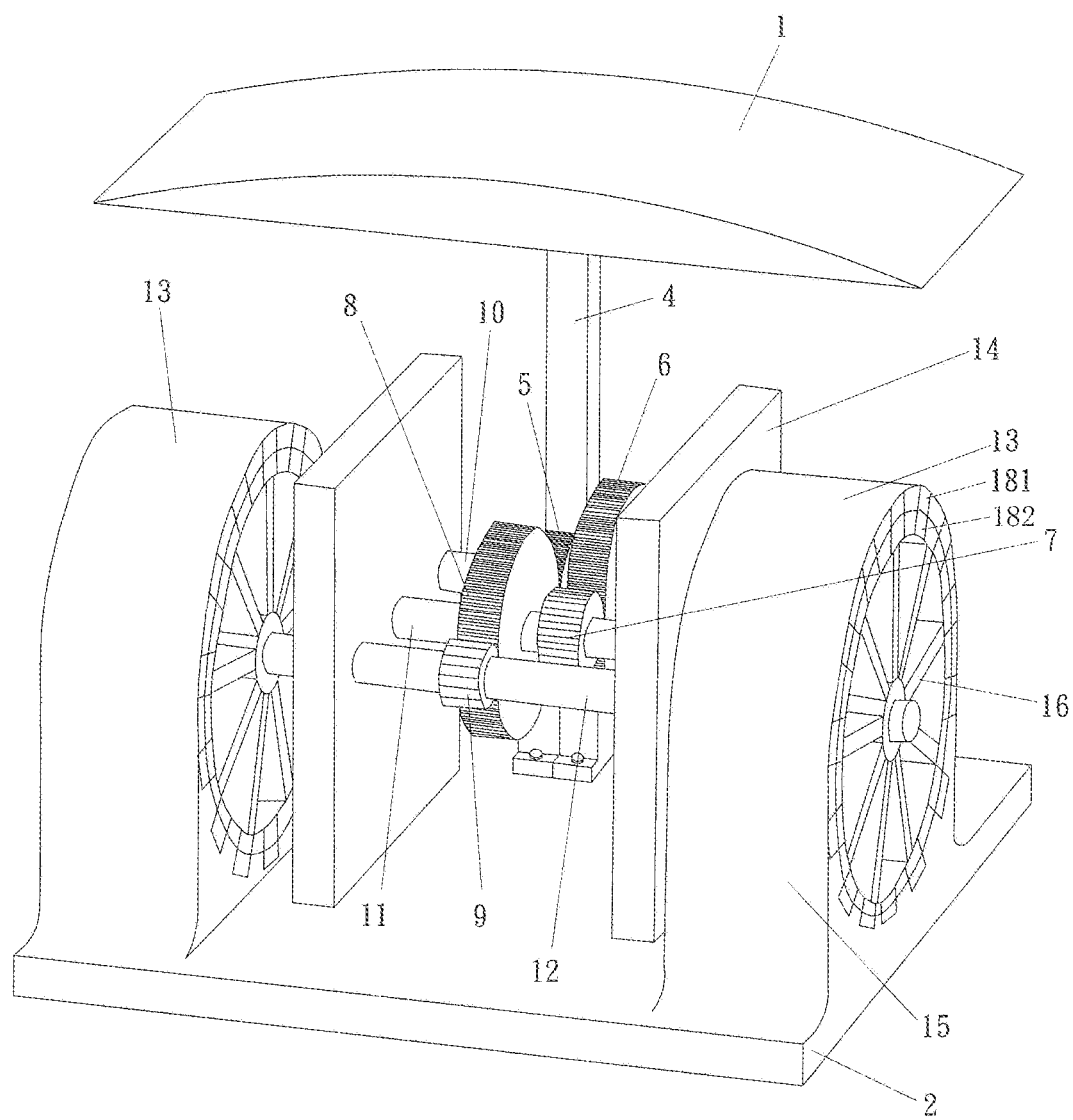
FIG. 2 is a structural diagram of upper deceleration strip of the present invention.

FIG. 2 is the schematic diagram of generating mechanism, including a gear transmission structure and generating disc 13.

Figure 4:
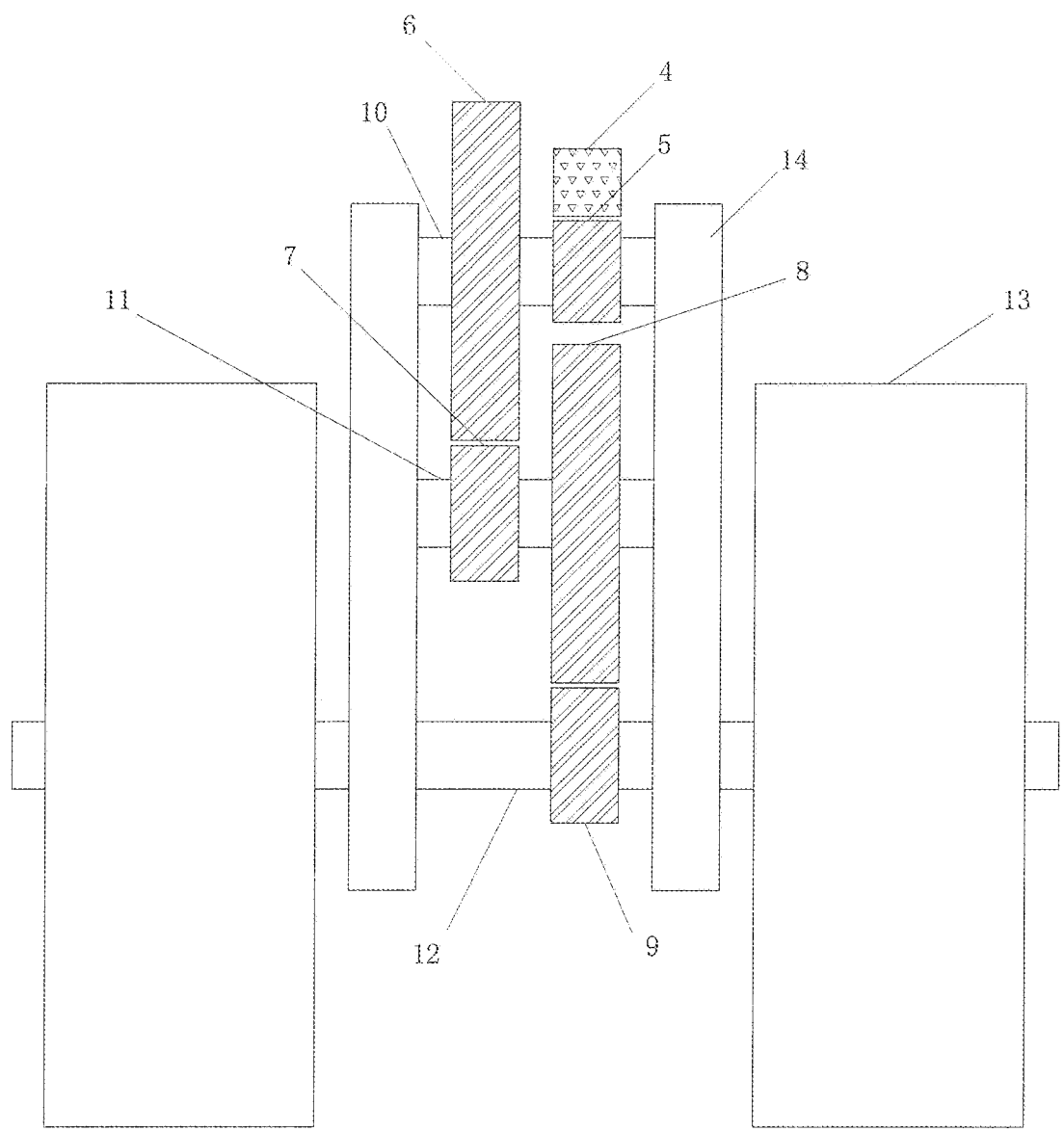
FIG. 4 is a structural plan of gear transmission of the present invention.

FIG. 4 is the schematic plan of gear transmission structure, including a rack, gears and transmission shafts. The gear transmission implements two-stage acceleration. The rack 4 engages with gear I 5, the gear I 5 and gear II 6 are disposed on the transmission shaft I 10, the gear II 6 engages with gear III 7 to implement primary acceleration. The gear III 7 and gear IV 8 are disposed on the transmission shaft II 11, the gear IV 8 engages with gear V 9 to implement secondary acceleration. Finally, the gear V 9 drives the left and right generating discs 13 to rotate through transmission shaft III 12. The three transmission shafts 10, 11, 12 are fixed to a vertical steel plate 14.

FIG. 5 is the structural representation of fixed outer disc and rotary inner disc. A turn of self-developed arched piezoelectric transducer 17 is placed on the fixed outer disc 15. The first magnets 181 are fixed to the apex of the arched piezoelectric transducer 17. Heteropolar magnets 182 of the same size are placed in the opposite position of the rotary inner disc 16. The quantity of the second magnets 182 of rotary inner disc 16 is 14, coincident with the quantity of the first magnets 181 of the arched piezoelectric transducer 17 of fixed outer disc 15. When the rotary inner disc 16 rotates one circle, all the arched piezoelectric transducers 17 are pressed 14 times respectively, higher frequency represents larger electricity generation and steadier power generation, in comparison to planar piezoelectric transducer, the frequency has greater effect on the generating power of arched piezoelectric transducer.

FIG. 6 is the structural representation of arched piezoelectric transducer. The arched piezoelectric transducer 17 is bonded of 65 Mn spring steel sheet base 19. PZT arched piezoelectric ceramic 20 and aluminum sheet 21, its bearing capacity can be 1.5 kN, and its generating power can be over 30 times of planar piezoelectric transducer.

The arched piezoelectric transducer 17 is connected to the input terminal of synchronous charge extraction circuit by a conductor, the output terminal of synchronous charge extraction circuit is connected to the super capacitor energy storage system by a conductor.

We claim:

1. A nonlinear magnetic force-based arched piezoelectric ceramic energy harvesting deceleration strip comprising:
    an outer case and an internal generating mechanism; wherein the outer case structure includes an upper deceleration strip and a casing; the casing is embedded in a pavement structure by excavating an upper part of a surface course;
    a rebounding mechanism located between the upper deceleration strip and casing to restore a pressed upper deceleration strip;
    wherein the generating mechanism includes a rack, a gear set and generating discs; the rack is disposed at a bottom of the upper deceleration strip and moving up and down therewith; the rack engages with a first gear, the first gear and a second gear are fixed to a first transmission shaft; the second gear engages with a third gear to implement primary acceleration; the third gear and a fourth gear are fixed to a second transmission shaft; the fourth gear engages with a fifth gear to implement secondary acceleration; finally, the fifth gear drives the generating discs to rotate through a third transmission shaft; the first transmission shaft, second transmission shaft and third transmission shaft are rotatably connected to a vertical steel plate; each of the generating discs comprises a fixed outer disc and a rotary inner disc; an arched piezoelectric transducer is placed on the fixed outer disc; a first magnet is fixed to an apex of the arched piezoelectric transducer, a repellent second magnet of the same size is placed in the opposite position of the rotary inner disc; the arched piezoelectric transducer comprises a spring steel sheet base, an arched piezoelectric ceramic combined with the spring steel sheet base and an aluminum sheet adhering to the arched piezoelectric ceramic; the arched piezoelectric ceramic is fired and molded in an arched mold with preset curvature.

2. The nonlinear magnetic force-based arched piezoelectric ceramic energy harvesting deceleration strip defined in claim 1, a guide channel is disposed in the upper part of the casing, the upper deceleration strip is disposed in the guide channel, at least three guiding axles are fixed to the bottom of the upper deceleration strip, a return spring is fitted over each of the at least three guiding axles, the upper end of return spring props the bottom of the upper deceleration strip, and the lower end props the bottom of the casing guide channel; the bottom of the casing is provided with a guide hole corresponding to the guiding axle, the guiding axle is inserted in the guide hole.

3. The nonlinear magnetic force-based arched piezoelectric ceramic energy harvesting deceleration strip defined in claim 1, the fixed outer disc is fixed to the casing through the vertical steel plate.

4. The nonlinear magnetic force-based arched piezoelectric ceramic energy harvesting deceleration strip defined in claim 1, wherein the fixed outer disc and the spring steel base are bolted, the first magnet is fixed to the aluminum sheet.

5. The nonlinear magnetic force-based arched piezoelectric ceramic energy, harvesting deceleration strip defined in claim 2, wherein the fixed outer disc and the spring steel base are bolted, the first magnet is fixed to the aluminum sheet.

6. The nonlinear magnetic force-based arched piezoelectric ceramic energy harvesting deceleration strip defined in claim 3, wherein the fixed outer disc and the spring steel base are bolted, the first magnet is fixed to the aluminum sheet.

7. The nonlinear magnetic force-based arched piezoelectric ceramic energy harvesting deceleration strip defined in claim 1, wherein the spring steel sheet base and aluminum sheet are customized according to the curvature of arched piezoelectric ceramic.

8. The nonlinear magnetic force-based arched piezoelectric ceramic energy harvesting deceleration strip defined in claim 2, wherein the spring steel sheet base and aluminum sheet are customized according to the curvature of arched piezoelectric ceramic.

9. The nonlinear magnetic force-based arched piezoelectric ceramic energy harvesting deceleration strip defined in claim 3, wherein the spring steel sheet base and aluminum sheet are customized according to the curvature of arched piezoelectric ceramic.

10. The nonlinear magnetic force-based arched piezoelectric ceramic energy harvesting deceleration strip defined in claim 1, wherein the quantity of the second magnets of the rotary inner disc is 14, coincident with the quantity of the first magnets of the fixed outer disc, and the quantity of arched piezoelectric transducers of fixed outer disc is 14.

11. The nonlinear magnetic force-based arched piezoelectric ceramic energy harvesting deceleration strip defined in claim 2, wherein the quantity of the second magnets of the rotary inner disc is 14, coincident with the quantity of the first magnets of the fixed outer disc, and the quantity of arched piezoelectric transducers of fixed outer disc is 14.

12. The nonlinear magnetic force-based arched piezoelectric ceramic energy harvesting deceleration strip defined in claim 3, wherein the quantity of the second magnets of the rotary inner disc is 14, coincident with the quantity of the first magnets of the fixed outer disc, and the quantity of arched piezoelectric transducers of fixed outer disc is 14.

13. The nonlinear magnetic force-based arched piezoelectric ceramic energy harvesting deceleration strip defined in claim 1, the piezoelectric ceramics of the same rotary inner disc are connected in series, and the piezoelectric ceramics of different rotary inner discs are connected in parallel.

14. The nonlinear magnetic force-based arched piezoelectric ceramic energy harvesting deceleration strip defined in claim 2, the piezoelectric ceramics of the same rotary inner disc are connected in series, and the piezoelectric ceramics of different rotary inner discs are connected in parallel.

15. The nonlinear magnetic force-based arched piezoelectric ceramic energy harvesting deceleration strip defined in claim 3, the piezoelectric ceramics of the same rotary inner disc are connected in series, and the piezoelectric ceramics of different rotary inner discs are connected in parallel.

\* \* \* \* \*